United States Patent [19]
Raney et al.

[11] Patent Number: 5,951,771
[45] Date of Patent: Sep. 14, 1999

[54] PLASMA JET SYSTEM

[75] Inventors: Daniel V. Raney, Mission Viejo; Michael Scott Heuser, Ranch; Stephen M. Jaffe, Lake Forest; C. B. Shepard, Jr., Laguna Niguel, all of Calif.

[73] Assignee: Celestech, Inc., Laguna Niguel, Calif.

[21] Appl. No.: 08/719,823

[22] Filed: Sep. 30, 1996

[51] Int. Cl.$^6$ .................................................. C23C 4/00
[52] U.S. Cl. .................................................. 118/723 ER
[58] Field of Search ............... 118/723 ER, 723 DC, 118/723 HC; 219/121.5, 121.48, 121.51

[56] References Cited

U.S. PATENT DOCUMENTS

| | | | |
|---|---|---|---|
| 4,728,863 | 3/1988 | Wertheimer | 315/111.21 |
| 5,204,145 | 4/1993 | Gasworth | 427/577 |
| 5,235,155 | 8/1993 | Yamada et al. | 219/121.51 |
| 5,256,205 | 10/1993 | Schmitt, III et al. | 118/723 |
| 5,342,660 | 8/1994 | Cann et al. | 427/577 |
| 5,396,043 | 3/1995 | Couch, Jr. et al. | 219/121.5 |

Primary Examiner—Thi Dang
Attorney, Agent, or Firm—David P. Gordon; David S. Jacobson; Thomas A. Gallagher

[57] ABSTRACT

A plasma jet CVD system includes gas injectors and a stand-off ring. The gas injectors have outlet holes preferably flared to approach the expansion angle of the injected jet, thereby keeping the holes substantially free from entrained atomic hydrogen. The injectors are arranged counter-rotational to the swirl of the primary jet, providing a more uniform mixture of hydrocarbons and atomic hydrogen. The stand-off ring provides vents for cooler gases to enter the nozzle, thereby decreasing the overall temperature of the injectors and decreasing the temperature gradient experienced by the injectors, thereby preventing injector cracking. In addition the vents reduce shear, thereby increasing jet velocity and increasing the deposition rate for the coating. In addition, a new method of injector design permits optimal mixing characteristics to be obtained across various recipes whereby the ratio of the mass flux of the primary flow of the jet to the mass flux of the injected flow from the downstream injectors is kept constant.

13 Claims, 7 Drawing Sheets

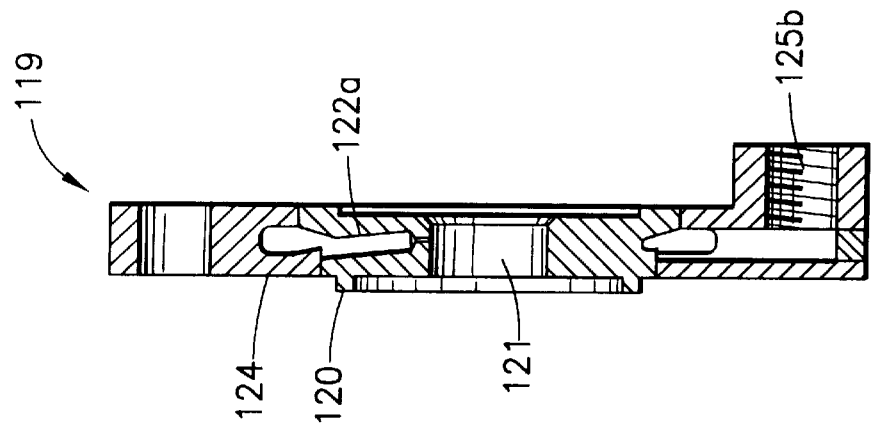
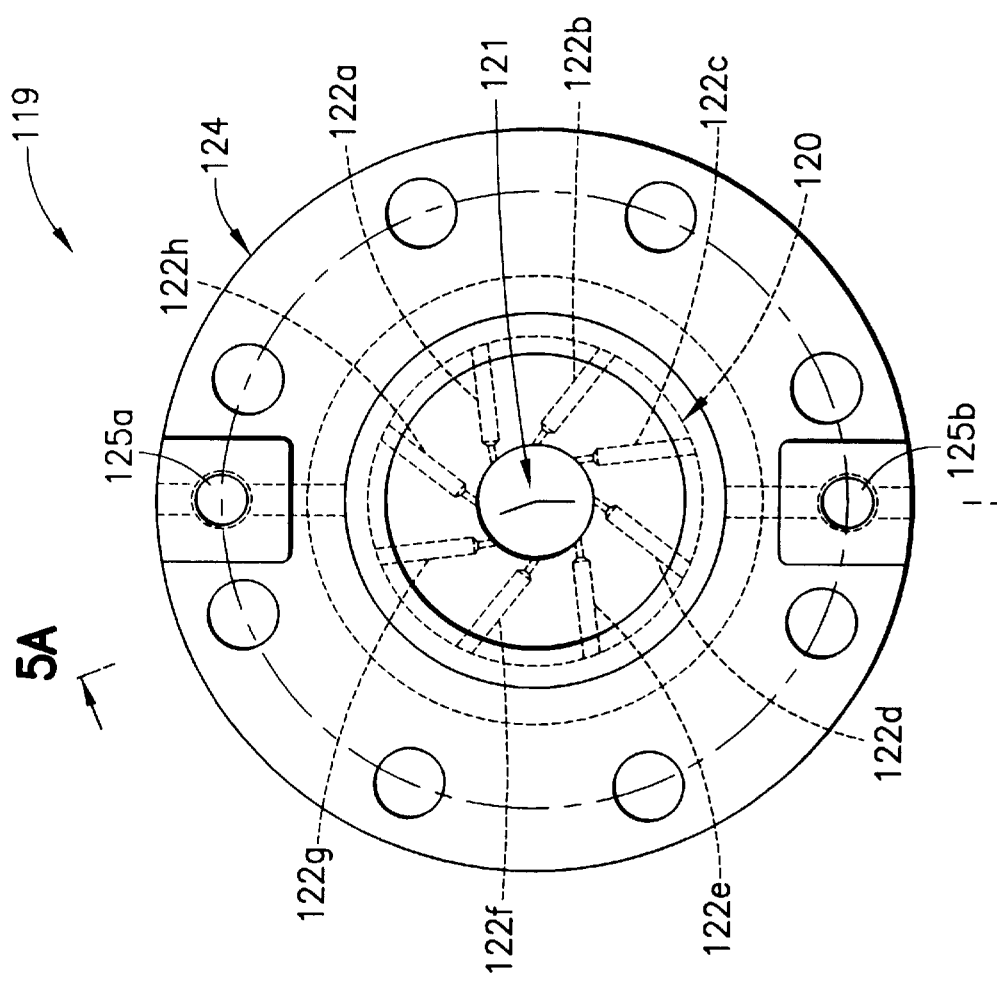

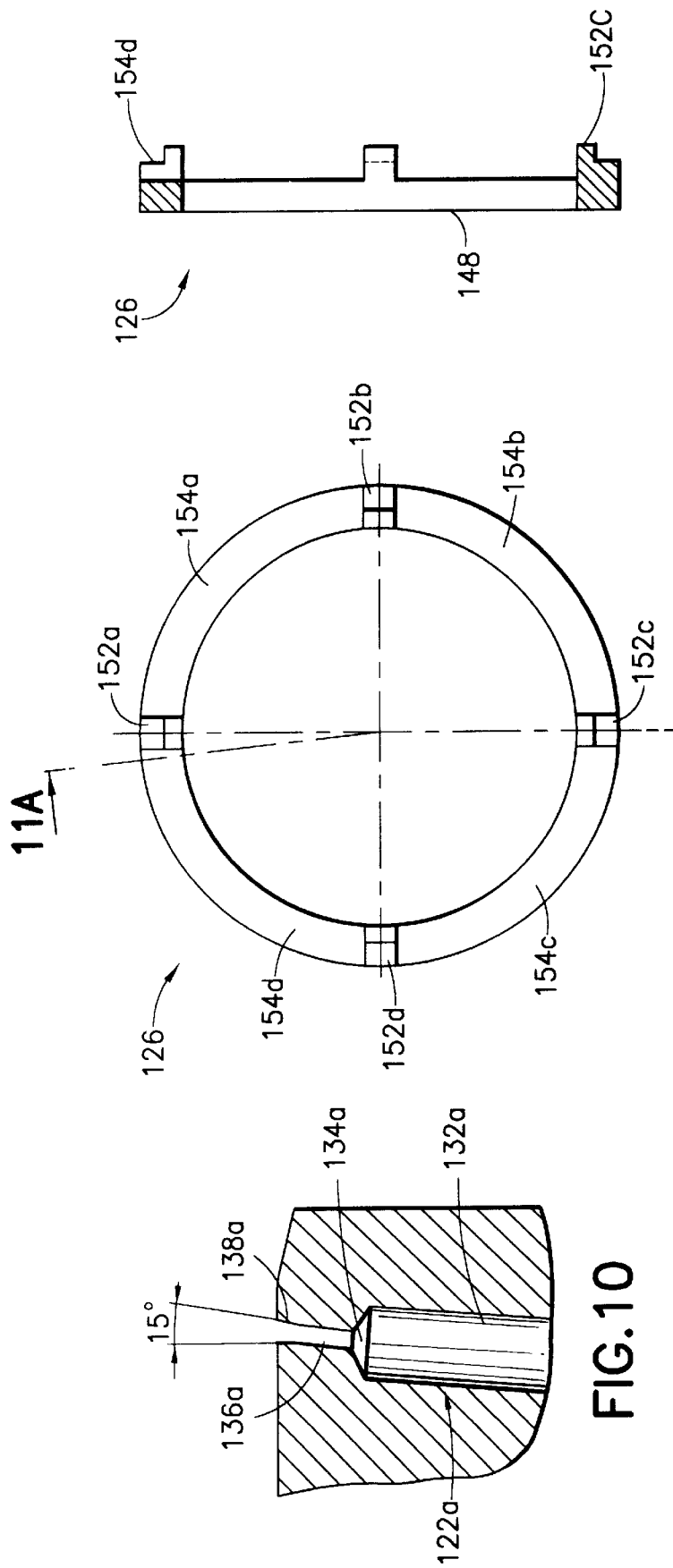

PLASMA JET SYSTEM

BACKGROUND OF THE INVENTION

1. Field of the Invention

This invention relates broadly to a chemical vapor deposition system. More particularly, this invention relates to the injectors and the relationship between the injectors and the nozzle in a plasma jet chemical vapor deposition system for producing diamond films.

2. State of the Art

The utility for high quality thin diamond films for various applications is well known. Superior physical, chemical, and electrical properties make diamond films desirable for many mechanical, thermal, optical and electronic applications. For example, diamond has the highest room-temperature thermal conductivity of any material, a high electric field breakdown (~$10^7$ V/cm), and an air stable negative electron affinity. These properties make possible high power, high frequency transistors and cold cathodes, which cannot be made with any semiconductor other than diamond.

One method for producing thin diamond films is by using a chemical vapor deposition (hereinafter 'CVD') system. In CVD systems, a mixture of hydrogen and a gaseous hydrocarbon, such as methane, is activated and contacted with a substrate to produce a diamond film on the substrate. The hydrogen gas is disassociated into atomic hydrogen, which is then reacted with the hydrocarbon to form condensable carbon radicals including elemental carbon. The carbon radicals are then deposited on a substrate to form a diamond film. Some CVD methods use a hot filament, typically at temperatures up to 2000° C., to provide the thermal activation temperatures necessary to bring about the conversion described above. Other CVD methods use a plasma jet.

In some plasma jet methods, hydrogen gas is introduced into a plasma torch which produces a hydrogen plasma jet by means of a direct current arc (hereinafter "DC arc"), or an alternating current arc ("AC arc"), or microwave energy. The plasma torch is hot enough to reduce gases to their elemental form. However, the energy level of the plasma jet has a tendency to fluctuate. One method of stabilizing the energy level of the plasma is to utilize a vortex design in the CVD system. Tangential injection of the hydrogen gas into the arc processor may be used to impart the vortex to the hydrogen, in gaseous and atomic form.

The vortex design results in a controlled swirl of plasma. Hydrogen gas is introduced into the primary jet and some of the hydrogen gas is thereby disassociated into monatomic hydrogen. The hydrogen (in both elemental and molecular states), swirling according to the swirl of the plasma, is forced through a downstream injector system which introduces jets of hydrocarbon needed to react with the elemental hydrogen to form diamond films.

Referring to FIG. 1, a prior art DC arc plasma jet system 10 is shown. The assembly includes a hydrogen gas inlet 12, a cathode 14, a cylindrical chamber 16 having cylindrical walls 17, an anode 18, downstream injectant ports 20a, 20b, a gas injection disc 22 having a plurality of radially-positioned injectors 24a–24h (shown only with respect to 24a and 24b for purposes of clarity), and a nozzle 26 directed toward the substrate. The hydrogen gas enters the hydrogen gas inlet 12 and is heated to a partial plasma state by an arc across the cathode 14 and the anode 18. The arc is controlled by solenoids (not shown) surrounding the chamber. The tangential injection of the hydrogen contains the plasma and imparts the vortex swirl to the plasma. Downstream, hydrocarbon injectant and carrier hydrogen gas enter through the injectant ports 20a, 20b into the gas injection disc 22, and out of the injectors 24a, 24b where the injectant mixes and reacts with the hydrogen plasma, resulting in a mixture of molecular hydrogen, atomic hydrogen and carbon radicals which exits through the nozzle 26.

FIG. 2 illustrates the gas injection disc 22 provided with radially aligned injectors 24a–24h. Each injector is aligned along a radius formed from the periphery of the ring to the center of the ring. Referring to FIG. 3, with reference to one injector 24a, the injector is a substantially cylindrical bore having three portions: a relatively large diameter inlet hole 30, a tapered frustoconical portion 32, and a relatively small diameter outlet hole 34.

There are several known problems associated with state of the art plasma jet systems. For example, various challenges and problems have been encountered with the hydrocarbon injectors. With reference to FIG. 3, a first shortcoming of the prior art injectors is that when using high enthalpy, high energy rate recipes, the injector outlet holes clog. One potential cause of the clogging is that the expanding injected jets entrain atomic hydrogen from the primary jet, bringing atomic hydrogen into the injectors and forming diamond or diamond-like carbon deposits at the outlet hole.

Another problem associated with the injectors of a plasma jet system is that when using a vortex stabilized arc engine, the vortex has a detrimental effect on downstream mixing of the injected hydrocarbon gas. The outer swirl of the vortex consists mainly of molecular hydrogen in equilibrium between the centrifugal force of the swirl and the resultant static pressure gradient throughout the jet. The atomic hydrogen, with half the mass of molecular hydrogen, is drawn towards the center of the swirling jet. Radially injected hydrocarbon, being many times heavier than molecular hydrogen, is forced to the outermost portion of the swirling jet, resulting in a non-uniform mixture of hydrogen and hydrocarbons. Consequently, a diamond film produced from a non-uniform mixture may have a slow growth rate and poor quality.

An additional problem with the use of high enthalpy, high energy rate recipes is that the injectors are subject to excessive heating and are subject to high thermal gradients caused by non-uniform cooling of the injectors at shutdown. The excessive heating and thermal gradient cause the injectors to crack and may further contribute to injector hole clogging. Referring back to FIGS. 1 and 2, two possible causes for the excessive heating of the injectors 24a–24h are direct impingement of recirculated arc gas on the bottom face 22a of the gas injection disc 22, and conduction from the nozzle 26 which is heated by the recirculated gas.

Furthermore, the mixing of downstream injected hydrocarbon gas with a primary flow of swirling hydrogen is a key consideration affecting film growth rate. The flow of hydrocarbon injectant out of the injector is often optimized for mixing with a given flow of hydrogen only by trial and error. However, once a specific injector has been found to give optimum results for a given primary flow of hydrogen it would be desirable to be able to design a hydrocarbon injector which provides the same level of mixing at a different flow rate of injectant through the injector without entering into a new trial and error process.

SUMMARY OF THE INVENTION

It is therefore an object of the invention to provide a plasma jet injection system having an improved injection system for coating diamond films on a substrate.

It is another object of the invention to provide an injection system which has injectors having a reduced likelihood of clogging.

It is a further object of the invention to provide an injection system which has injectors having a reduced likelihood of cracking.

It is an additional object of the invention to provide an injection system which has uniform mixing of primary jet hydrogen and downstream jet hydrocarbons.

It is also an object of the invention to provide a method for designing injectors permitting a predetermined flow of injectant.

In accord with these objects which will be discussed in detail below, a plasma jet CVD system includes a hydrogen gas inlet into a containment chamber, a cathode at the upper portion of the chamber, an anode with a constricted diameter relative to the chamber and located at the lower portion of the chamber, a gas injection disc having injectors in non-radial alignment, a vented stand-off ring, and a nozzle directed toward the substrate. The hydrogen gas enters the hydrogen gas inlet and is heated into a plasma jet by an arc across the cathode and the anode. A tangential injection of the hydrogen gas into the containment chamber contains the plasma and imparts the vortex swirl to the plasma. An injection port introduces hydrocarbon injectant into the injectors of the gas injection disc. According to one aspect of the invention, the injectors are arranged such that they inject hydrocarbon counter-rotational to the vortex swirl. This novel arrangement provides a uniform mixture of hydrocarbon with the hydrogen, resulting in a reactant mixture of atomic hydrogen and carbon radicals. According to another aspect of the invention, each injector has an outlet hole preferably having a flared exit, which keep the holes substantially free from entrained atomic hydrogen. The reactant mixture flows through the stand-off ring and out of the nozzle, where the reactant mixture is deposited onto a substrate located in the fluid path of the nozzle. The stand-off ring effectively creates vents between the gas injection disc and the nozzle, connecting the nozzle to the gas injection disc by four small posts arranged at 90° around the ring. Ambient gas is permitted to enter through the vents. The stand-off ring allows the flowing reactant mixture to draw cooler gases into the nozzle and thereby decreases the formation of recirculation cells at the bottom face of the injector. This prevents hot arc gas from impinging on the injector, and thereby reduces the injector temperature.

In addition, a new method of injector design permits optimal mixing characteristics to be obtained across various hydrogen/hydrocarbon injectant recipes whereby the ratio of the mass flux of the primary flow of the hydrogen jet to the mass flux of the injected flow of hydrocarbon from the downstream injectors is kept constant.

Additional objects and advantages of the invention will become apparent to those skilled in the art upon reference to the detailed description taken in conjunction with the provided figures.

BRIEF DESCRIPTION OF THE DRAWINGS

FIG. 5 is a top view of the gas injection disc assembly of the invention;

FIG. 5A is a section through 5A—5A in FIG. 5;

FIG. 10 is an enlarged sectional schematic of an injector according to the invention;

FIG. 11 is a top view of a gap ring according to the invention; and

FIG. 11A is a section through 11A—11A in FIG. 11.

DETAILED DESCRIPTION OF THE PREFERRED EMBODIMENTS

Figure 1:
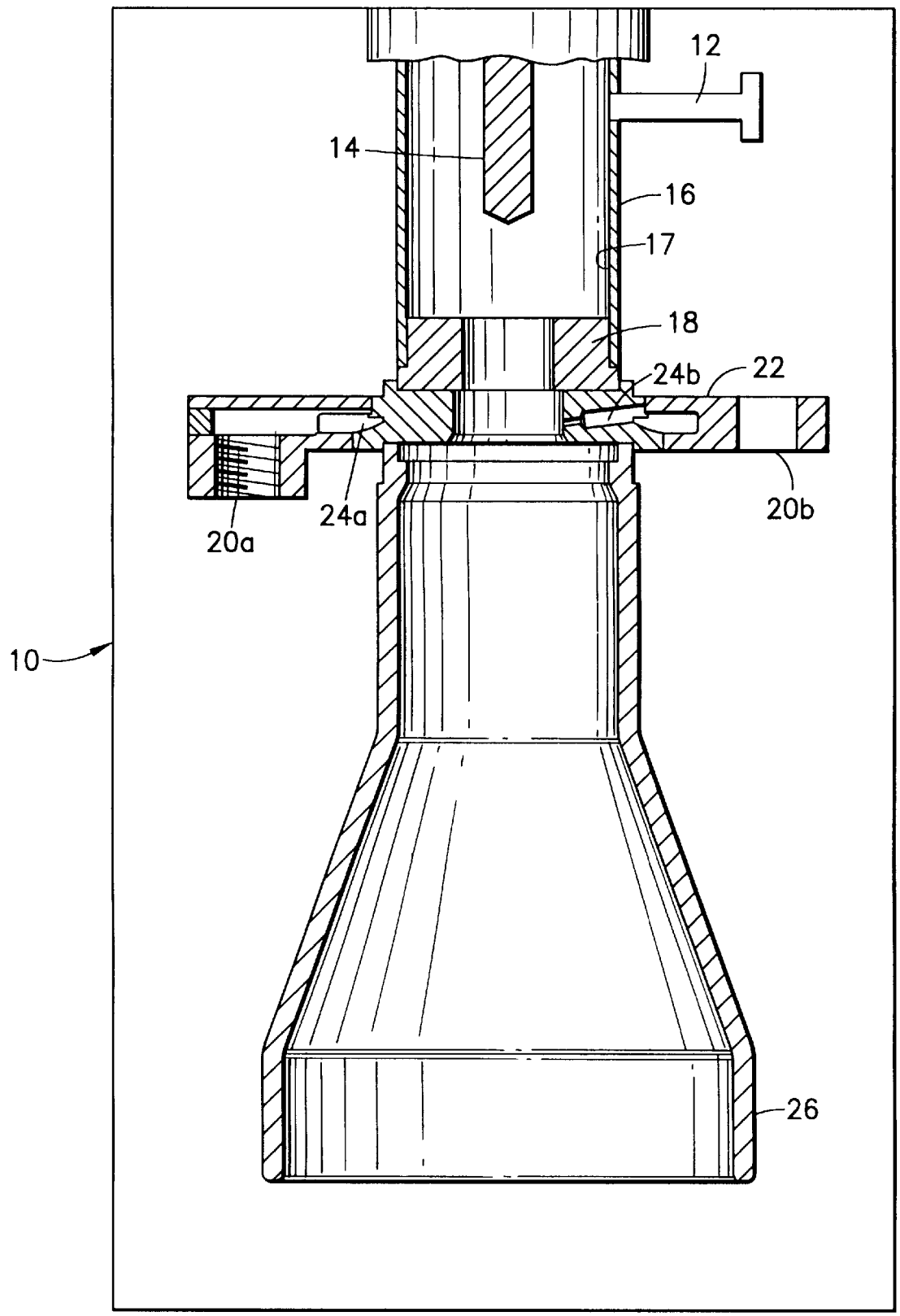
FIG. 1 is a broken sectional view of the prior art plasma injection system.
Figure 2:
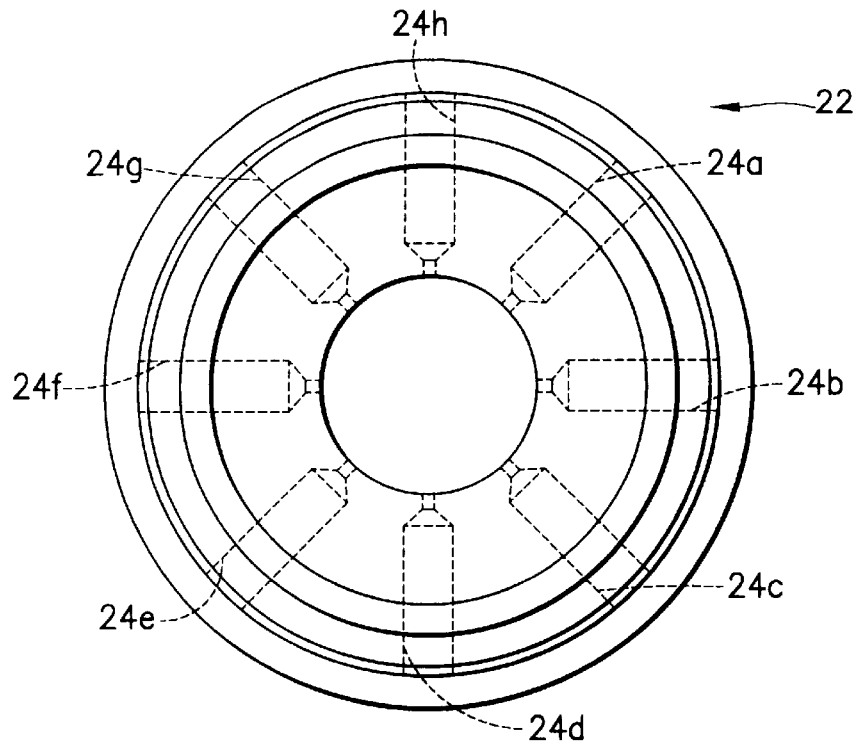
FIG. 2 is a top view schematic of the prior art gas injection disc.
Figure 3:
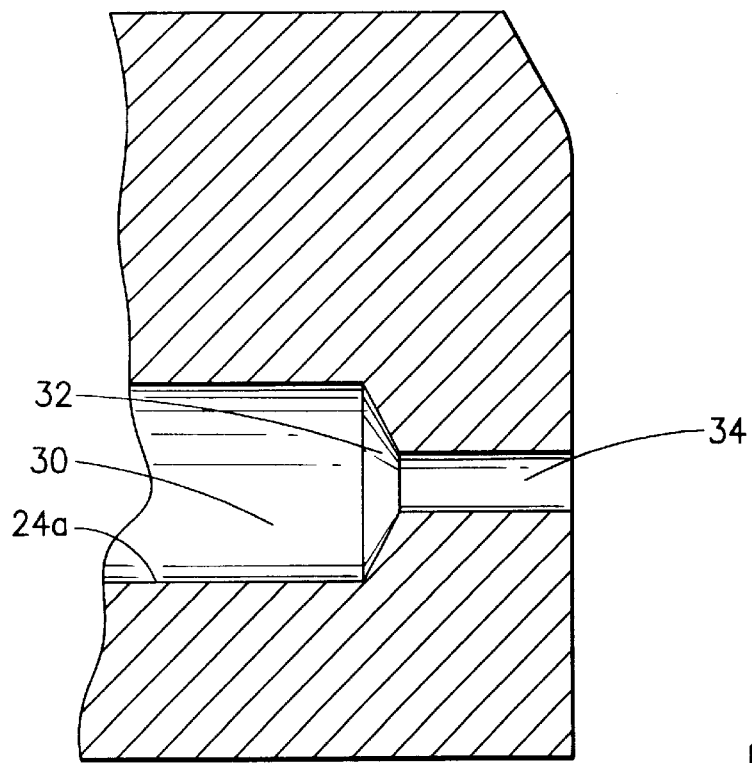
FIG. 3 is a broken sectional view of the prior art injector hole design.
Figure 4:
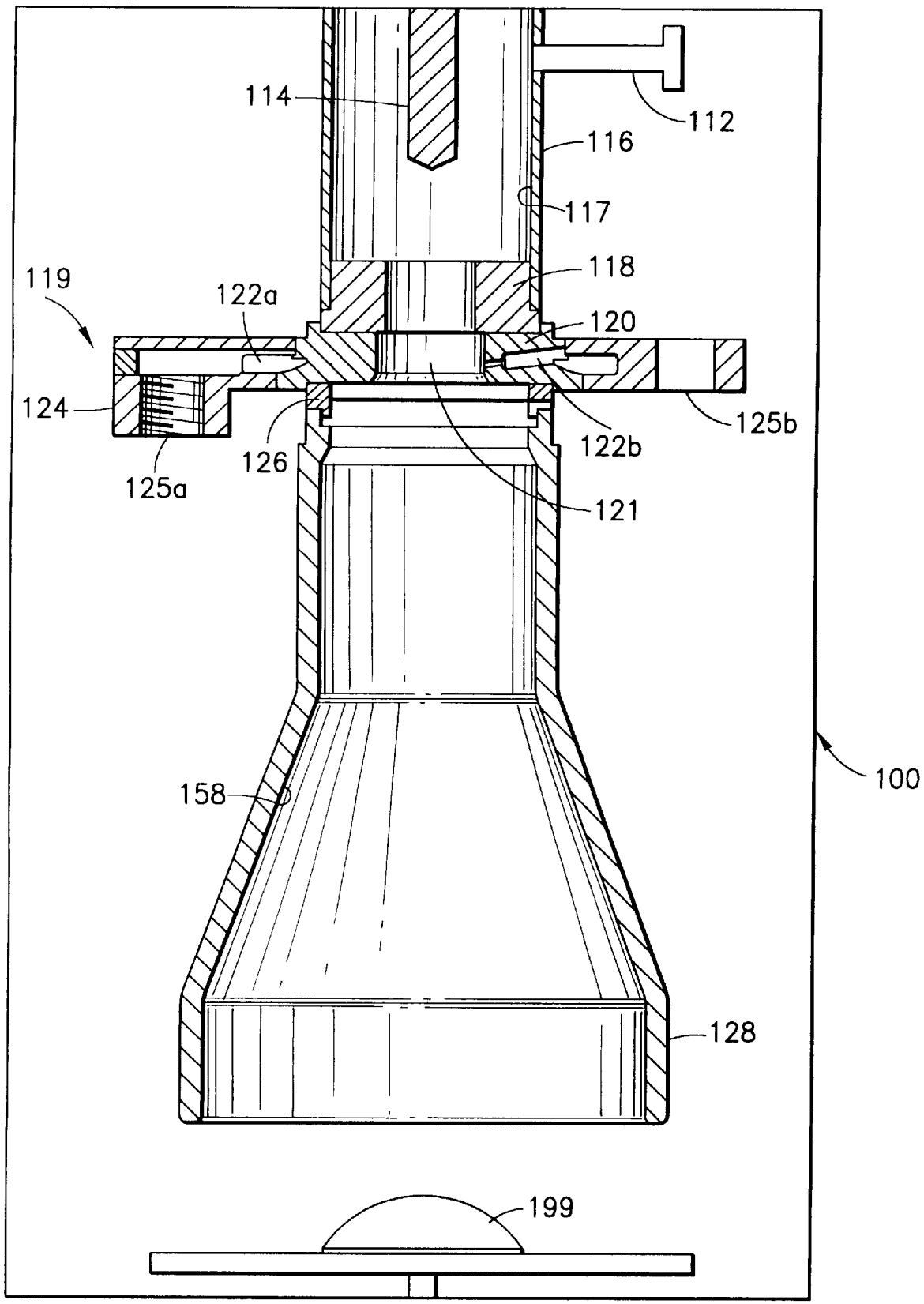
FIG. 4 is the broken sectional view of the plasma jet system of the invention.

Referring to FIG. 4, a plasma jet system 100 for a plasma jet CVD system includes a hydrogen gas inlet 112 for the passage of hydrogen gas into a containment chamber 116 having an inner wall 117. A cathode 114 is located at the upper portion of the chamber 116. An anode 118 having a constricted diameter relative to the chamber is located at the bottom portion of the chamber. The hydrogen gas enters the hydrogen gas inlet 112 and is heated into a plasma jet by an arc across the cathode 114 and the anode 118. The arc is controlled by a solenoid (not shown) surrounding the containment chamber. The tangential injection of the hydrogen gas and the applied magnetic field contain the plasma and impart a vortex to the plasma. Adjacent the anode 118 is a gas injection disc assembly 119, through which hydrocarbon and carrier hydrogen gas is injected into the plasma swirl, forming a reactant mixture of hydrocarbon and hydrogen. The reactant mixture flows through a stand-off ring 126 and out through a nozzle 128, where a reactant mixture of hydrocarbon and hydrogen is directed toward a substrate 199 located in the path of the nozzle.

Referring to FIGS. 5 and 5A, the gas injection disc assembly 119 includes a gas injection disc 120 and a gas injection disc mounting ring 124. The gas injection disc 120 has a throat 121 and a plurality of injectors 122a–122h organized in an arrangement which is counter-rotational to the swirl of the jet, as explained below. Two injection ports 125a, 125b in the gas injection disc mounting ring 124 introduce hydrocarbon injectant into the injectors 122a–122h, and the injectant is thereby sprayed counter-rotationally to the swirl of the hydrogen jet.

Figure 7:
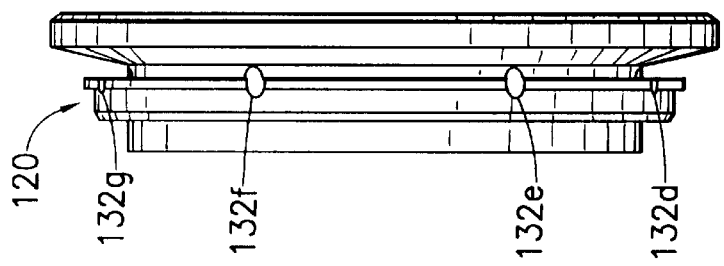
FIG. 7 is a side elevational view of the gas injection disc of FIG. 6 rotated by 90°.
Figure 6A:
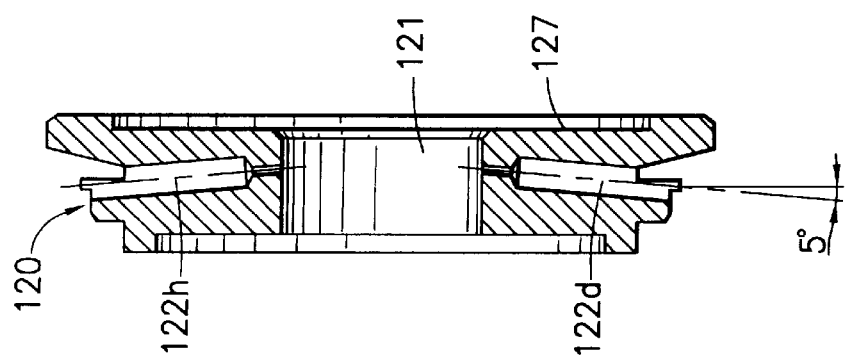
FIG. 6A is a section through 6A—6A in FIG. 6.
Figure 6:
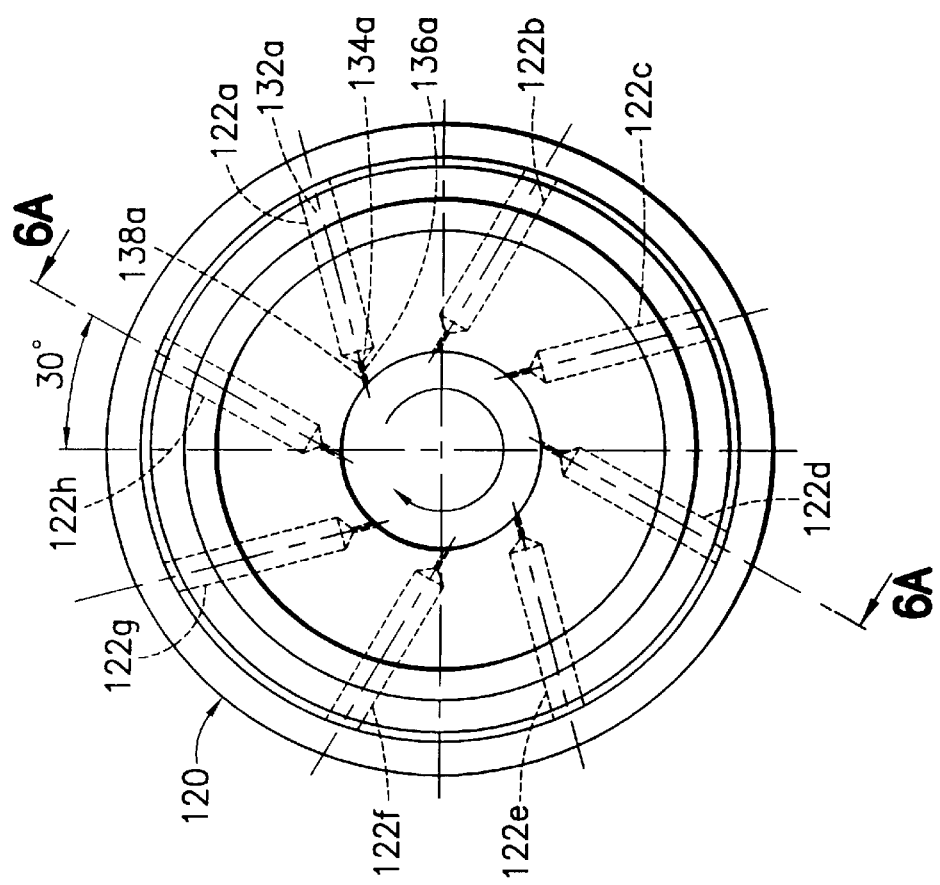
FIG. 6 is a top view of the gas injection disc according to the invention.

Referring to FIGS. 6, 6A, and 7, the longitudinal axis of each injector 122a–122h is angled off-axis from the radius which runs from an inlet 132a–132h of the injector to the center axis of the gas injection disc 120. The direction of the angular offset is such that the injectors 122a–122h will stream hydrocarbon injectant at an angle opposing the swirl of the primary jet (indicated by the arrow in FIG. 6), reducing the vortex and providing a more uniform reactant mixture of atomic hydrogen and hydrocarbon. As shown with respect to injector 122h, the offset is preferably 30° counter-rotational to the swirl. Compared to radial-type injectors, this design significantly increases the amount of injectant reaching the center of the jet compared to prior art radial injectors. Consequently, at the same flow rates, diamond growth rates have been found to increase by 25% compared to radial-type injectors. In addition, as seen in FIG. 6A, the injectors 122a–h are also preferably angled toward a bottom surface 127 of the gas injector disc 120 by 5° from a line normal to the center axis of the gas injector disc 120.

Figure 8:
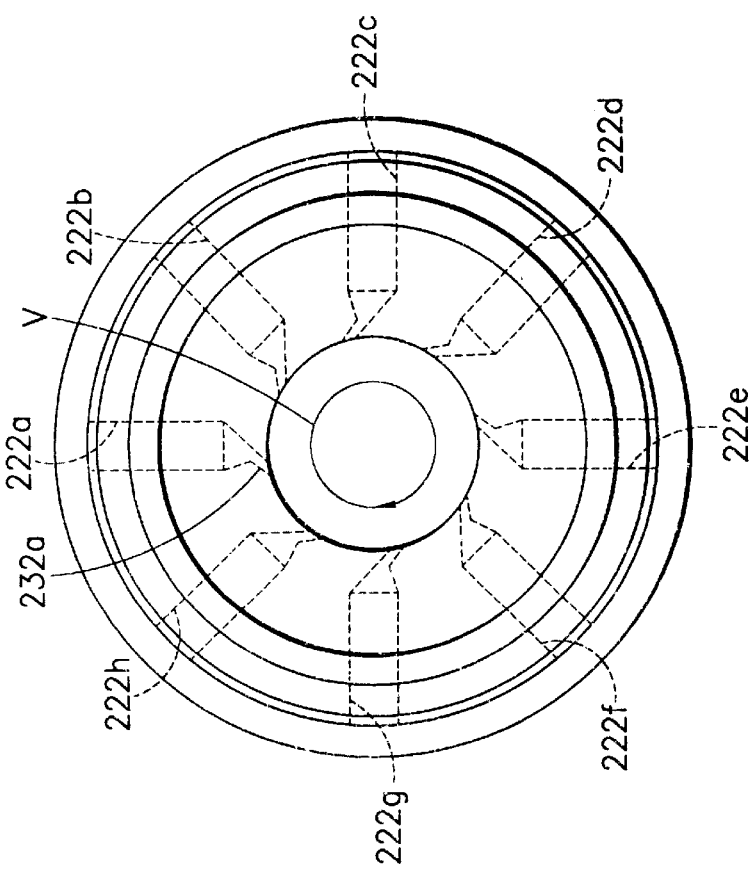
FIG. 8 is a top view of a second embodiment of the gas injection disc according to the invention.

Turning to FIG. 8, in a second embodiment (with numbers increased by 100 referring to like parts of the first embodiment) the injectors 222a–h may be kept in radial arrangement with only the outlet holes 236a–h counter-rotationally angled off-axis.

Figure 9:
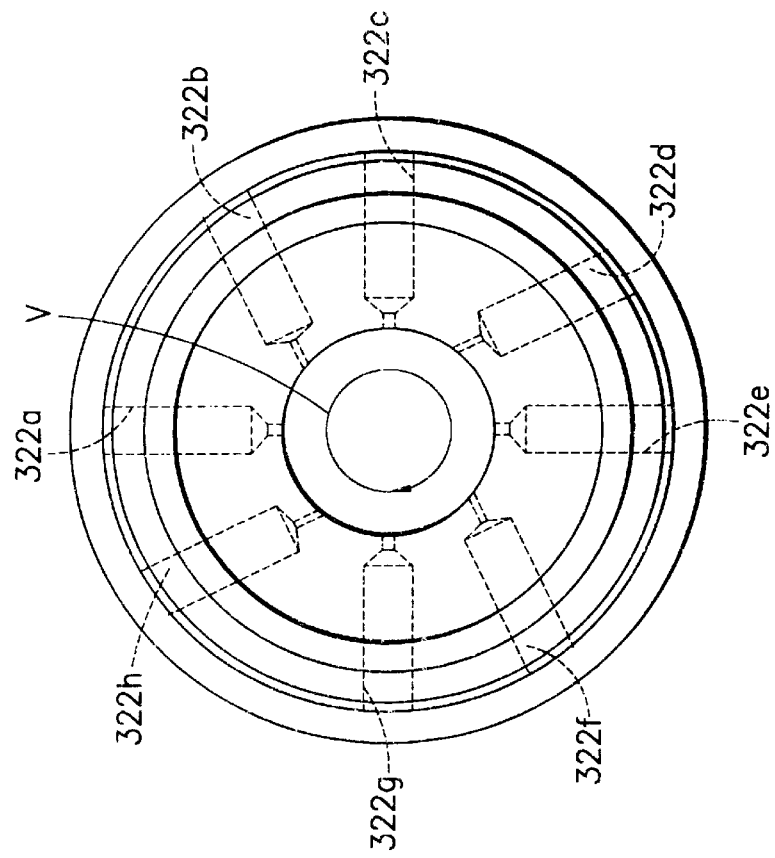
FIG. 9 is a top view of a third embodiment of the gas injection disc according to the invention.

Referring to FIG. 9, in third embodiment (with numbers increased by 200 referring to like parts of the first embodiment) the injectors 322a–h may be organized alternatingly in radial 322a, 322c, 322e, 322g and counter-rotational 322b, 322d, 322f, 322h arrangements.

While the first embodiment of the invention having all injectors arranged to stream injectant counter-rotational to the swirl of the vortex is most preferable, it will be appreciated that each alternate embodiment offers an increase in the uniformity of mixing over the prior art and consequently provides better results than prior art systems.

Turning now to FIG. 10, in accord with another aspect of the invention, each injector 122a–122h (shown with respect to one injector 122a) is a substantially cylindrical bore preferably including three portions: a relatively large diameter inlet hole 132a, a frustoconical portion 134a, and a relatively smaller diameter outlet hole 136a having a flared exit 138a. The flared exit 138a is flared to match the expansion angle of the jet of hydrocarbon exiting the injector 122a. As a result, the boundary layer between the injected jet and the exit hole 138a is reduced and migration of atomic hydrogen into the outlet hole 136a is reduced. A flare of 15° is preferable, based on the observed expansion angle of the injected jet and also having been demonstrated effective through experiment. However, other angles above 0° and up to and including 45° will also provide improved performance over the prior art. Additionally, as the prior art injectors show evidence of clogging at the outlet hole, enlarging the outlet hole increases the useful lifetime of the injector because much more buildup would have to occur before the nominal outlet hole size would be reduced.

The injectors 122a–122h (222a–222h, 322a–322h) can have an outlet hole having a diameter determined according to a new method of design. Once a first injector has been found by trial and error to supply a flow of hydrocarbon injectant into a primary jet of hydrogen such that an optimal level of mixing of hydrocarbon and hydrogen results, a new injector can be designed for a different recipe of hydrocarbon and hydrogen while maintaining the optimal level of mixing even though a different flow of hydrocarbon injectant is used. It has been discovered that if the new injector is designed to keep the mass flux ratio the same as that with the first injector, the new injector will provide the same optimal mixing level as that provided by the first injector. For instance, if for a given primary jet flow $Q_p$ an optimal level of mixing has been attained for a downstream injectant flow $Q_s$ when using an injector with an outlet hole having a diameter $D_1$, an optimal mixing level will also be obtained for a new injectant flow $Q_{sn}$ at the same primary jet flow $Q_p$ if the outlet hole diameter is changed such that the new diameter $D_2$ is determined by $D_2 = D_1(Q_{sn}/Q_s)^{1/2}$.

Utilizing the new injector design method, it will be appreciated that once an optimally performing injector has been obtained it will be a simple operation to design an injector for an alternate downstream injectant flow by changing only the dimension of the outlet hole diameter.

Turning to FIGS. 11 and 11A, a stand-off ring 126 is provided. The stand-off ring is a high temperature alloy ring, preferably made of TZM Mo alloy, which includes a planar surface 148 on a first side and four posts 152a–152d offset by 90° around the ring on a second side. Referring back to FIG. 4, the standoff ring 126 is coupled to the gas injection disc 120 and the nozzle 128 such that the planar surface 148 abuts the gas injection disc 120 and the posts 152a–152d are seated against the nozzle 128. The spaces between the posts 152a–152d act as vents 154a–154d, and the flow of reactant mixture exiting the nozzle draws cooler ambient gas through the vents into the nozzle.

It will be appreciated that the stand-off ring 126 serves three cooling purposes. First, the stand-off ring prevents direct conduction of heat from the nozzle 128 to the injectors 122a–h. Second, the vents 154a–154d allow cooler gas to be drawn into the injector/nozzle area, cooling the injectors 122a–h and creating a layer of cool gas over the inside wall 158 of the nozzle 128. Third, the stand-off ring 126 decouples the gas injection disc 120, which has a relatively small surface area, from the nozzle 128, which has a relatively large surface area, so that upon cooldown the injectors 122a–h are subject to a decreased temperature gradient. Stand-off rings from 1/16 inch to 5/8 inch have been found to result in a gas injection disc temperature drop of approximately 200° C. when used with high heat hydrogen/hydrocarbon recipes.

It will also be appreciated that the stand-off ring 126 increases the deposition rate of the diamond film. The hot gas leaving the throat 121 of the gas injection disc 120 and entering into the larger volume of the nozzle 128 creates a low pressure region at the top of the nozzle (the Venturi effect). The low pressure region normally draws cooler gas in from the bottom of the nozzle. The cool gas being drawn up into the nozzle creates a shear region around the hot jet, causing it to spread. By introducing vents, the cool gas can now be drawn from the top of the nozzle and the amount of shear is reduced. As a result, the jet does not expand as much and therefore travels with greater velocity until it interacts with the boundary layer above the substrate. Because of the increased velocity, the boundary layer thickness is reduced, which results in an increased deposition rate.

There have been described and illustrated herein a plasma jet CVD system having several novel design elements and also a novel method of designing a hydrocarbon injector for an arc processor. While particular embodiments of the invention have been described, it is not intended that the invention be limited thereto, as it is intended that the invention be as broad in scope as the art will allow and that the specification be read likewise. Thus, while eight injectors have been disclosed with respect to the gas injection disc, it will be appreciated that fewer or more injectors may be used as well. Furthermore, while a 30° angle is preferable for the counter-rotational angle for the injectors, it will be understood that other angles more than 0° and less than 90° can be used. Also, while the stand-off ring has been disclosed to have a height of from 1/16 inch to 5/8 inch, it will be appreciated that a stand-off ring having another width may also be used. In addition, while several embodiments of the gas injection disc have been disclosed, wherein each embodiment shows an alternate organization of the injectors, it will be appreciated that a gas injection disc may be used which incorporates a combination of the illustrated arrangements. Moreover, it will be appreciated that while the invention has been disclosed with respect to a DC arc plasma jet system incorporating several novel features, it will be recognized that another type of plasma jet system, i.e., radio frequency or microwave, may utilize the novel features disclosed herein. Furthermore, a plasma jet system may be designed which selectively incorporates any one or more of the novel features. It will therefore be appreciated by those skilled in the art that yet other modifications could be made to the provided invention without deviating from its spirit and scope as so claimed.

We claim:

1. A plasma jet chemical vapor deposition system for depositing a diamond film on a substrate, comprising:
   a) a hydrogen inlet for introducing hydrogen into said system;
   b) means for producing a plasma jet containing said hydrogen;
   c) means for imparting and maintaining a swirl in said plasma jet;
   d) a gas injection disc defining a plurality of gas injectors, said plurality of gas injectors arranged so that an injectant will be injected counter-rotational to said swirl of said plasma jet and thereby create a substantially uniform mixture of said hydrogen and said injectant;
   e) means for supplying injectant to said plurality of injectors; and
   f) a nozzle through which said mixture flows and is deposited as the diamond film on the substrate.

2. An arc processor layout according to claim 1, further comprising:
   e) a vented stand-off ring coupled to and between said gas injection disc and said nozzle.

3. A plasma jet system according to claim 1, wherein:
   said injectors are each provided with a flared outlet hole, said outlet hole flared relative to a longitudinal axis of each of said injectors.

4. A plasma jet system according to claim 3, wherein:
   said outlet hole is flared by approximately 15°.

5. A plasma jet system according to claim 2, wherein:
   said injectors are each provided with a flared outlet hole, said outlet hole flared relative to a longitudinal axis of each of said injectors.

6. A plasma jet system according to claim 5, wherein:
   said outlet hole is flared by approximately 15°.

7. A plasma jet system according to claim 2, wherein:
   said vented stand-off ring has a height in the range of 1/16 inch to 5/8 inch.

8. A plasma jet system according to claim 1, wherein:
   said counter-rotational arrangement of said injector holes is such that each of said plurality of injectors is angularly offset by approximately 30° from a radius of said gas injection disc which passes through a peripheral-most portion of each of said plurality of injectors to a center of said gas injection disc.

9. A plasma jet chemical vapor deposition system for depositing a diamond film on a substrate, comprising:

a) a hydrogen inlet for introducing hydrogen into said system;
   b) means for producing a plasma jet containing said hydrogen;
   c) means for imparting and maintaining a swirl in said plasma jet;
   d) a gas injection disc defining a plurality of injectors, each of said gas injectors having,
      i) an inlet hole,
      ii) a frustoconical portion, and
      iii) a flared outlet hole flared relative to a longitudinal axis of each of said injectors;
   e) means for supplying injectant to said plurality of injectors, such that said injectant mixes with said hydrogen creating a reactant mixture; and
   f) a nozzle through which said reactant mixture flows and is deposited as the diamond film on the substrate.

10. A plasma jet system according to claim 9, further comprising:
    g) a vented stand-off ring coupled to and between said gas injection disc and said nozzle.

11. A plasma jet system according to claim 9, wherein:
    each of said flared outlet holes are flared by approximately 15°.

12. A plasma jet chemical vapor deposition system for depositing a diamond film on a substrate, comprising:
    a) a hydrogen inlet for introducing hydrogen into said system;
    b) means for producing a plasma jet containing said hydrogen;
    c) means for creating and imparting a swirl in said plasma jet;
    d) a gas injection disc defining a plurality of gas injectors;
    e) means for supplying injectant to said plurality of injectors, such that said injectant mixes with said hydrogen creating a reactant mixture;
    f) a nozzle through which said mixture flows and is deposited as the diamond film on the substrate; and
    g) a vented stand-off ring coupled to and between said gas injection disc and said nozzle.

13. A method of making a hydrocarbon injector for a plasma jet chemical vapor deposition system, wherein the plasma jet system has a swirl of plasma flowing at rate $Q_p$ and containing hydrogen, said method comprising:
    a) obtaining a first injector which introduces hydrocarbon injectant into the flowing swirl, wherein said first injector has an outlet diameter of $D_1$ units and supplies injectant to the swirl at a first flow rate of $Q_s$; and
    b) designing a second injector, said second injector supplying hydrocarbon injectant to the swirl at a second flow rate of $Q_{sn}$, wherein said second injector has an outlet diameter of $D_2$ units, $D_2$ being determined by $D_1(Q_{sn}/Q_s)^{1/2}$.

* * * * *